United States Patent
Jang

(10) Patent No.: US 10,164,806 B2
(45) Date of Patent: Dec. 25, 2018

(54) CLOCK DATA RECOVERY CIRCUIT USING PSEUDO RANDOM BINARY SEQUENCE PATTERN AND OPERATING METHOD FOR SAME

(71) Applicant: SAMSUNG ELECTRONICS CO., LTD., Suwon-si, Gyeonggi-Do (KR)

(72) Inventor: Jaehyeok Jang, Incheon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/485,851

(22) Filed: Apr. 12, 2017

(65) Prior Publication Data
US 2018/0006849 A1    Jan. 4, 2018

(30) Foreign Application Priority Data
Jun. 30, 2016 (KR) .................. 10-2016-0082777

(51) Int. Cl.
*H04L 25/03* (2006.01)
*H04L 7/04* (2006.01)
*H04L 5/00* (2006.01)
*H04L 27/00* (2006.01)

(52) U.S. Cl.
CPC ........ *H04L 25/03273* (2013.01); *H04L 7/042* (2013.01); *H04L 5/006* (2013.01); *H04L 2027/0036* (2013.01)

(58) Field of Classification Search
CPC ..... H04L 7/033; H04L 7/0331; H04L 7/0332; H04L 7/042; H04L 25/03273
See application file for complete search history.

(56) References Cited

U.S. PATENT DOCUMENTS

| | | | |
|---|---|---|---|
| 6,735,710 B1 | 5/2004 | Yoshikawa | |
| 7,408,996 B2* | 8/2008 | Hershbarger | H04B 3/548 |
| | | | 370/276 |
| 7,957,497 B2 | 6/2011 | Bae | |
| 8,724,683 B2 | 5/2014 | Baba | |
| 9,071,415 B2 | 6/2015 | Takeuchi | |
| 9,255,966 B2 | 2/2016 | Onodera | |
| 2005/0286643 A1* | 12/2005 | Ozawa | H03L 7/087 |
| | | | 375/242 |
| 2014/0153656 A1* | 6/2014 | Hsu | H04L 25/02 |
| | | | 375/259 |
| 2014/0160915 A1* | 6/2014 | Chen | H04B 3/54 |
| | | | 370/206 |
| 2014/0270030 A1* | 9/2014 | Hammad | H04L 7/0079 |
| | | | 375/371 |
| 2015/0043698 A1 | 2/2015 | Chang et al. | |
| 2015/0244549 A1 | 8/2015 | Crain | |
| 2015/0349945 A1 | 12/2015 | Green et al. | |

FOREIGN PATENT DOCUMENTS

| | | |
|---|---|---|
| KR | 1020070038340 A | 10/2007 |
| KR | 101252191 A | 4/2013 |

* cited by examiner

*Primary Examiner* — David B. Lugo
(74) *Attorney, Agent, or Firm* — Volentine, Whitt & Francos, PLLC

(57) ABSTRACT

A clock data recovery circuit includes; a clock recovery circuit that receives a pseudo random binary sequence (PRBS) pattern and generates a recovery clock by counting edges of the PRBS pattern, and a data recovery circuit that generates recovery data from at least one of the PRBS pattern and externally provided serial data.

20 Claims, 14 Drawing Sheets

CLOCK DATA RECOVERY CIRCUIT USING PSEUDO RANDOM BINARY SEQUENCE PATTERN AND OPERATING METHOD FOR SAME

CROSS-REFERENCE TO RELATED APPLICATIONS

This U.S. non-provisional patent application claims priority under 35 U.S.C. § 119 of Korean Patent Application No. 10-2016-0082777, filed on Jun. 30, 2016, the subject matter of which is hereby incorporated by reference.

BACKGROUND

The inventive concept relates to clock data recovery circuits, and more particularly, to clock data recovery circuits using a Pseudo Random Binary Sequence (PRBS) pattern.

Many contemporary electronic devices utilize one or more high-speed input/output (I/O) interfaces, such as a serial data link. Data is communicated (i.e., received and/or transmitted) via such high speed I/O interfaces at ever increasing rates. In order to coherently communicate data (e.g., data designated for communication via a particular channel), a high speed I/O interface (e.g., a receiver portion of a high speed I/O interface) typically requires a clock data recovery circuit.

In certain approaches to the communication of high speed data, a clock data recovery circuit may initially receive a so-called clock recovery (CR) pattern and an equalization (EQ) pattern. Using the CR and EQ patterns as initialization references, certain clock data recovery circuits may be configured (or prepared) to receive high speed data. The process of preparing a clock data recovery circuit to receive high speed data is referred to as training, and the CR and EQ patterns are respective training patterns. However, as performance demands placed upon contemporary electronic devices have increased, training approaches used by conventional clock data recovery circuits have proved too slow. That is, the delay engendered by the training of clock data recovery circuits is too long.

In contrast, certain communication approaches do not provide training pattern(s) to a clock data recovery circuit. Instead, high speed data is immediately provided. Such approaches eliminate the issue of undue training delay, but compared with properly trained clock data recovery circuits, the reliability of recovered data is degraded.

SUMMARY

One embodiment of the inventive concept provides a clock data recovery circuit including; a clock recovery circuit that receives a pseudo random binary sequence (PRBS) pattern and generates a recovery clock by counting edges of the PRBS pattern, and a data recovery circuit that generates recovery data from at least one of the PRBS pattern and externally provided serial data.

Another embodiment of the inventive concept provides a method of operating a clock data recovery circuit including a digitally controlled oscillator (DCO). The method includes; receiving a pseudo random binary sequence (PRBS) pattern, generating a counter clock from the PRBS pattern, recovering a clock of the DCO (DCO clock) with reference to the counter clock, recovering data from the PRBS pattern with reference to the DCO clock, and recovering serial data from externally provided serial data.

Another embodiment of the inventive concept provides a method of operating a data communication system. The method includes; providing parallel data from a first link layer to a transmission circuit, converting the parallel data into corresponding serial data in the transmission circuit, transmitting a pseudo random binary sequence (PRBS) pattern and the serial data from the transmission circuit to a reception circuit including a clock data recovery circuit via a channel, and using the clock data recovery circuit to recover the serial data by performing a frequency tracking operation, a phase tracking operation, an equalizing operation, a symbol alignment operation, and a bit error rate check operation with reference to the PRBS pattern.

DETAILED DESCRIPTION

Certain embodiments of the inventive concept will be described hereafter in some additional detail with reference to accompanying drawings.

Figure 1:
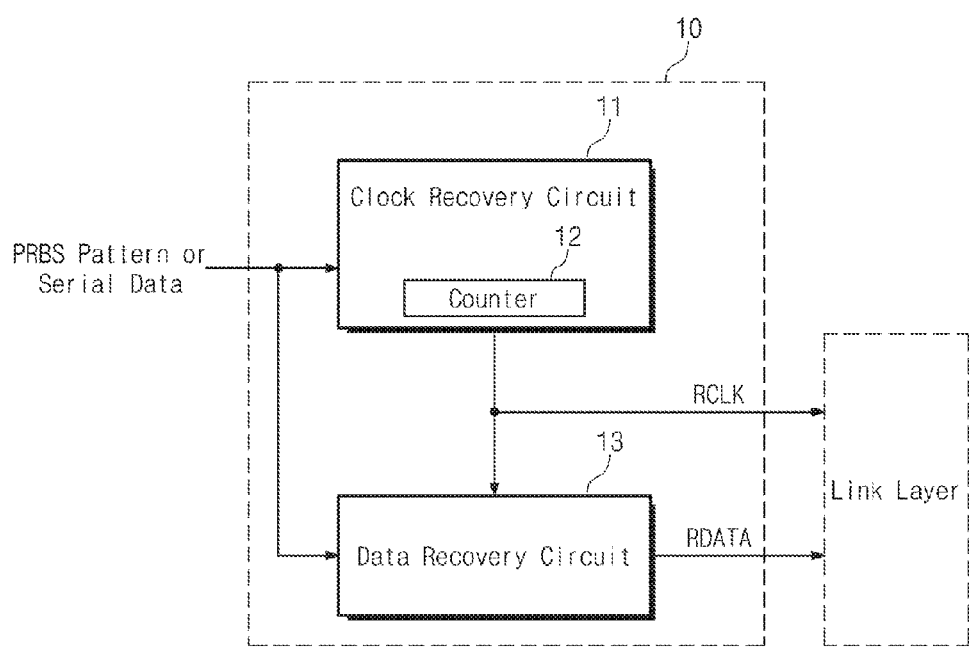
FIG. 1 is a block diagram illustrating a clock data recovery circuit according to an embodiment of the inventive concept.

FIG. 1 is a block diagram illustrating a clock data recovery circuit according to an embodiment of the inventive concept. Referring to FIG. 1, a clock data recovery circuit 10 may generally include a clock recovery circuit 11 and a data recovery circuit 13. The clock data recovery circuit 10 is assumed to receive a PRBS pattern and/or serial data from an external device. The PRBS pattern and/or serial data may be communicated to the clock data recovery circuit 10 in a single or differential ended manner. The clock recovery circuit 11 may coherently recover clock and/or data information from the received information without necessarily receiving an externally provided clock signal.

The PRBS pattern is assumed to be a random bit string having a defined periodicity. Thus, the PRBS pattern is not a truly (or perfectly) random bit string. The PRBS pattern may be generated from a PRBS pattern generator (not illustrated). The PRBS pattern generator may include a plurality of shift registers and an adder, for example.

In certain data communication approaches, the clock data recovery circuit 10 receives an externally provided PRBS pattern before receiving externally provided serial data. Under such conditions, the clock data recovery circuit 10 may perform the training using the PRBS pattern.

In the illustrated example of FIG. 1, the clock recovery circuit 11 includes a counter 12 that counts clock signal edges (i.e., level transitions) within the received PRBS pattern to generate a counted value. In response to the counted value generated by the counter 12, the clock recovery circuit 11 may generate a recovery clock RCLK. Hence, the clock recovery circuit 11 may generate the recovery clock RCLK using the PRBS pattern without reference to an externally provided clock signal.

In FIG. 1, the recovery clock RCLK is passed to the data recovery circuit 13 and an external link layer (e.g., a processor (e.g., an application processor), a data storage device, a display (e.g., LCD, OLED), etc.).

The data recovery circuit 13 may also receive the externally provided PRBS pattern and de-serialize the PRBS pattern. Thereafter, the data recovery circuit 13 may perform a symbol alignment and a bit error rate (BER) check. Here, the term "symbol alignment" may mean any operation capable of aligning de-serialized data, and the term "bit error rate" may mean any numerical indication of errant bits in the data to-be-communicated via the link layer. For example, the data recovery circuit 13 may perform one or more bit error rate (BER) check(s) and/or data correction operation to ensure that the data subsequently communicated to the link layer has a bit error rate less than an established threshold.

After the symbol alignment and bit error rate (BER) check are completed, the data recovery circuit 13 may receive externally provided serial data. The data recovery circuit 13 may de-serialize the received serial data. Hereafter, such de-serialized data is termed recovery data (RDATA) and is communicated from the data recovery circuit 13 to the link layer.

Figure 2:
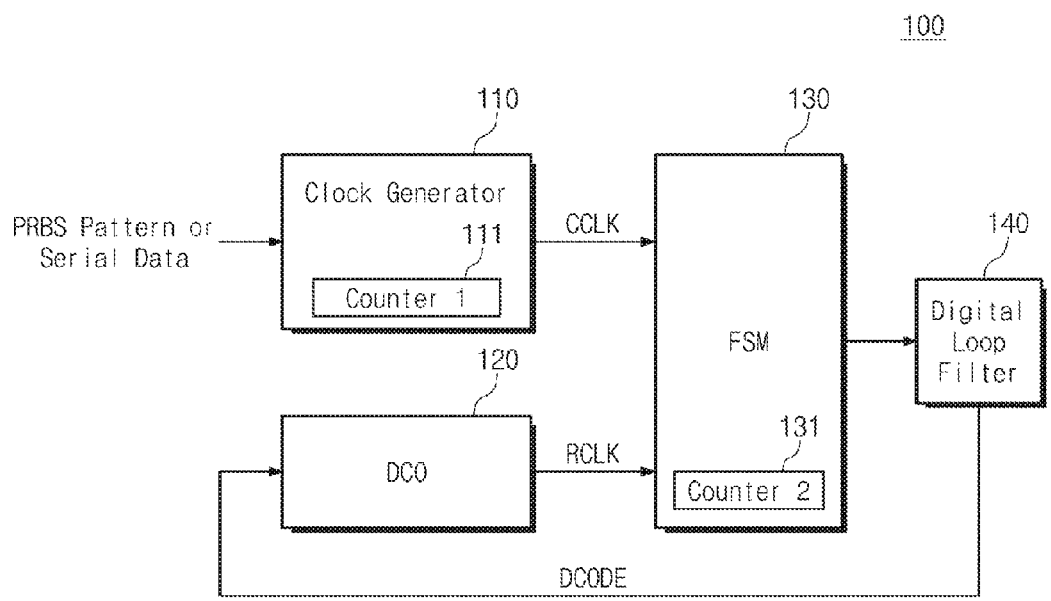
FIG. 2 is a block diagram further illustrating in one example the clock recovery circuit of FIG. 1.

FIG. 2 is a block diagram further illustrating in one example (100) the clock recovery circuit 11 of FIG. 1. Referring to FIG. 2, the clock recovery circuit 100 may include a clock generator 110, a digitally controlled oscillator (DCO) 120, a finite state machine (FSM) 130, and a digital loop filter 140.

The clock generator 110 may generate a counter clock CCLK with reference to the PRBS pattern, where the counter clock CCLK is applied to the FSM 130. That is, the clock generator 110 may count edges within the PRBS pattern and may generate a corresponding counter clock CCLK. To this end, the clock generator 110 may include a first counter 111.

The DCO 120 may generate the recovery clock CCLK with reference to a digital code DCODE provided by the digital loop filter 140. In communication approaches wherein the clock recovery circuit 100 initially receives the PRBS pattern before receiving payload data, a clock generated by the DCO 120 may not be immediately recovered. Instead, once the PRBS pattern is received by the clock recovery circuit 100 and following a predetermined time, a clock generated by the DCO 120 may be recognized and used as the recovery clock RCLK which is applied to the FSM 130.

The FSM 130 may compare the counter clock CCLK with the recovery clock RCLK to determine whether a frequency of the recovery clock RCLK is relatively higher or lower than a frequency of the counter clock CCLK. To this end, the FSM 130 may include a second counter 131. The comparison result (or frequency difference) determined by the FSM 130 may be applied to the digital loop filter 140.

If the frequency difference between the counter clock CCLK and the recovery clock RCLK is relatively large, the FSM 130 may rapidly correct the frequency of the recovery clock RCLK. In such circumstances, the range of change for the digital code DCODE provided by the digital loop filter may be large. However, if the frequency difference is relatively small, the FSM 130 may more precisely correct the frequency of the recovery clock RCLK. In such circumstances, the range of change for the digital code DCODE may be small. In this manner, the clock recovery circuit 100 of FIG. 2 may adjust the allowable range of change for the digital code DCODE in response to the determined frequency difference between the counter clock CCLK and the recovery clock RCLK. To precisely correct the recovery clock RCLK, the clock recovery circuit 100 may further include a divider (not illustrated).

Within the foregoing configuration, the digital loop filter 140 may generate the digital code DCODE with reference to the frequency difference (or comparison result) received from the FSM 130. In the case where the comparison result described above is immediately transmitted to the DCO 120, the recovery clock RCLK may oscillate. Accordingly, the digital loop filter 140 may accumulate the comparison result to prevent the recovery clock RCLK from oscillating. Although not illustrated in FIG. 2, the digital loop filter 140 may include an adder or a multiplier, where an accumulation rate for the digital loop filter 140 may be determined with reference to the time for the recovery clock RCLK. In such embodiments, the digital loop filter 140 may generate the digital code DCODE with reference to the accumulation result.

Figure 3:
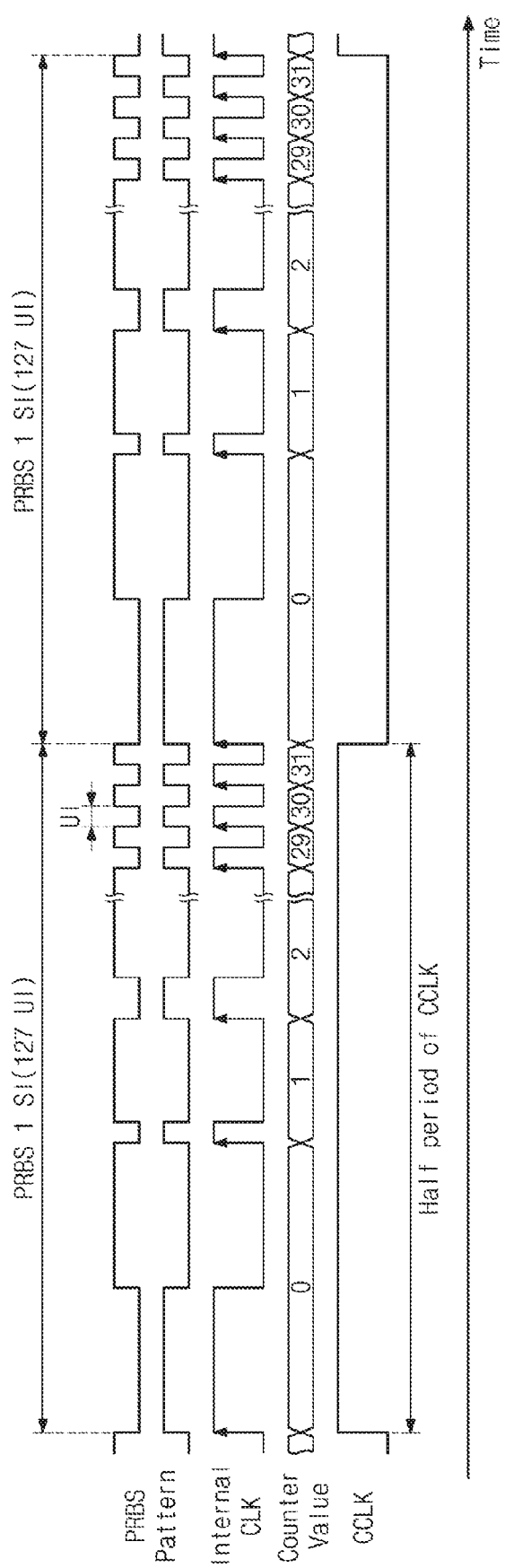
FIG. 3 is a timing diagram further illustrating operation of the clock generator of FIG. 2.

FIG. 3 is a timing diagram further illustrating operation of the clock generator 110 of FIG. 2. Referring to FIGS. 2 and 3, it is assumed that the clock recovery circuit 100 receives a PRBS pattern having (e.g.,) 127 unit intervals (UI). Alternate UI numbers may include 63, 255, 511, 1023, etc.

The clock generator 110 is assumed to generate an internal clock CLK with reference to the PRBS pattern, where the internal clock CLK may be an amplification pattern of the PRBS pattern, for example. The first counter 111 may increase the counted value on each rising edge of the internal clock CLK and/or the falling edge of the internal clock CLK. FIG. 3 assumes a rising edge counting approach.

A maximum counted value that may be generated by the first counter 111 may vary according to the PRBS pattern. Referring to FIG. 3 and the case where the PRBS pattern has 127 UIs, the maximum counted value generated by the first counter 111 is assumed to be 31.

The clock generator 110 may generate the counter clock CCLK with reference to the counted value. When the counted value rolls over from the maximum counted value to an initial counted value (i.e., the first counter 111 transitions from the maximum counted value to an initial counted value), the clock generator 110 may invert the phase of the counter clock CCLK, bearing in mind that the PRBS pattern has a defined periodicity. Hence, the phase of the counter clock CCLK may invert for each period of the PRBS pattern. Thus, the period of the counter clock CCLK may be two times that of the PRBS pattern period.

Figure 4:
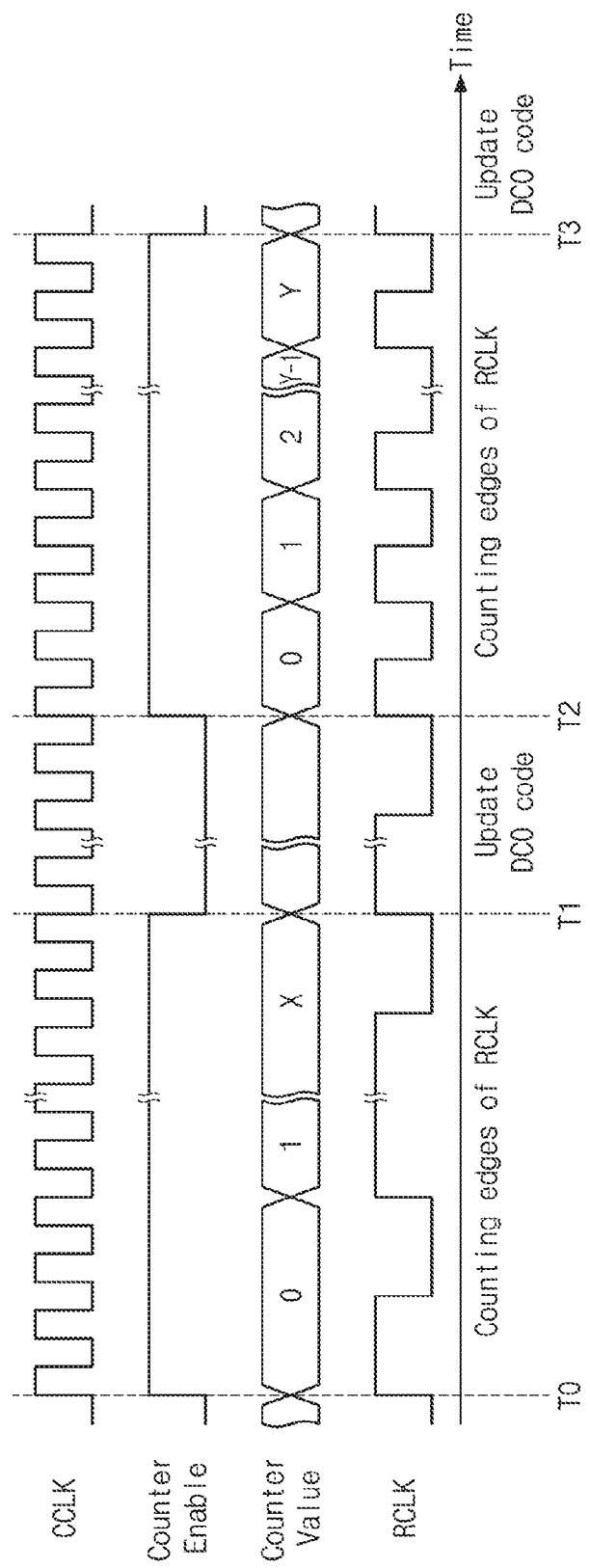
FIG. 4 is a timing diagram further illustrating operation of the clock recovery circuit of FIG. 2.

FIG. 4 is a timing diagram further illustrating operation of the clock recovery circuit 100 of FIG. 2. Referring to FIG. 4, the clock recovery circuit 100 may adjust the frequency of the recovery clock RCLK within a target frequency range with reference to the PRBS pattern.

Referring to FIGS. 2 and 4, the clock generator 110 may generate the counter clock CCLK having a regular period with reference to the PRBS pattern. The FSM 130 may generate a counter enable signal determining whether or not the second counter 131 operates with reference to the counter clock CCLK.

During T0~T1, that is, during a time period wherein a counter enable signal is high (e.g., enabled), the second counter 131 may increment the counted value on each rising edge of the recovery clock RCLK. Thus, an enabled counter enable signal enables the second counter 131. Although not illustrated, in another embodiment, the second counter 131 may increase the counted value on each falling edge of the recovery clock RCLK. During T0~T1, the counted value is assumed to reach a value of 'X' (a maximum counted value or the limit of the counting range).

Thus, WHEN the counted value reaches the value X, the recovery clock RCLK reaches a target frequency range. Here, the reference range may be set according to the PRBS pattern or serial data which the clock recovery circuit 100 receives. The reference range may be set by counting the PRBS pattern. To store the reference range, the FSM 130 may include a register (not shown). Referring to FIG. 4, the frequency of the recovery clock RCLK is less than a frequency of the counter clock CCLK. The counting value X is out of the reference range. Thus, the FSM 130 may check to determine whether the frequency of the recovery clock RCLK is less than the target frequency range.

During T1~T2, the FSM 130 apply a comparison result (e.g., a frequency difference between the counter clock CCLK and recovery clock RCLK) to the digital loop filter 140. The digital loop filter 140 may accumulate the comparison result to update a digital code DCODE. When the updated digital code DCODE is applied to the DCO 120, the frequency of the recovery clock RCLK may be increased.

During T2~T3, the counter enable signal is again enabled, and the FSM 130 may repeat the operation performed during T0~T1, recognizing that the frequency of the recovery clock RCLK was increased by the updated digital code DCODE. Hence, during T2~T3, the counted value may reach a value of Y.

Referring to FIG. 4, the frequency of the recovery clock is less than the frequency of the counter clock CCLK. The counting value Y is out of the reference range. The FSM 130 may check to determine whether the frequency of the recovery clock RCLK is less than the target frequency range.

After T3, the FSM 130 may again apply the comparison result to the digital loop filter 140. The clock recovery circuit 100 repeatedly performs the operation which was performed during T0~T2. This operation may be called a frequency tracking. The clock recovery circuit 100 may perform the frequency tracking operation until the counted value reaches the reference range.

The clock recovery circuit 100 operates in a digital control method. In the case where the frequency tracking operation is completed, the counting value may be periodically changed within the reference range. This means that the frequency of the recovery clock RCLK is close to the target frequency. After the frequency tracking operation is completed, the clock recovery circuit 100 may perform a phase tracking operation. The phase tracking operation will be described in FIG. 6.

Figure 5:
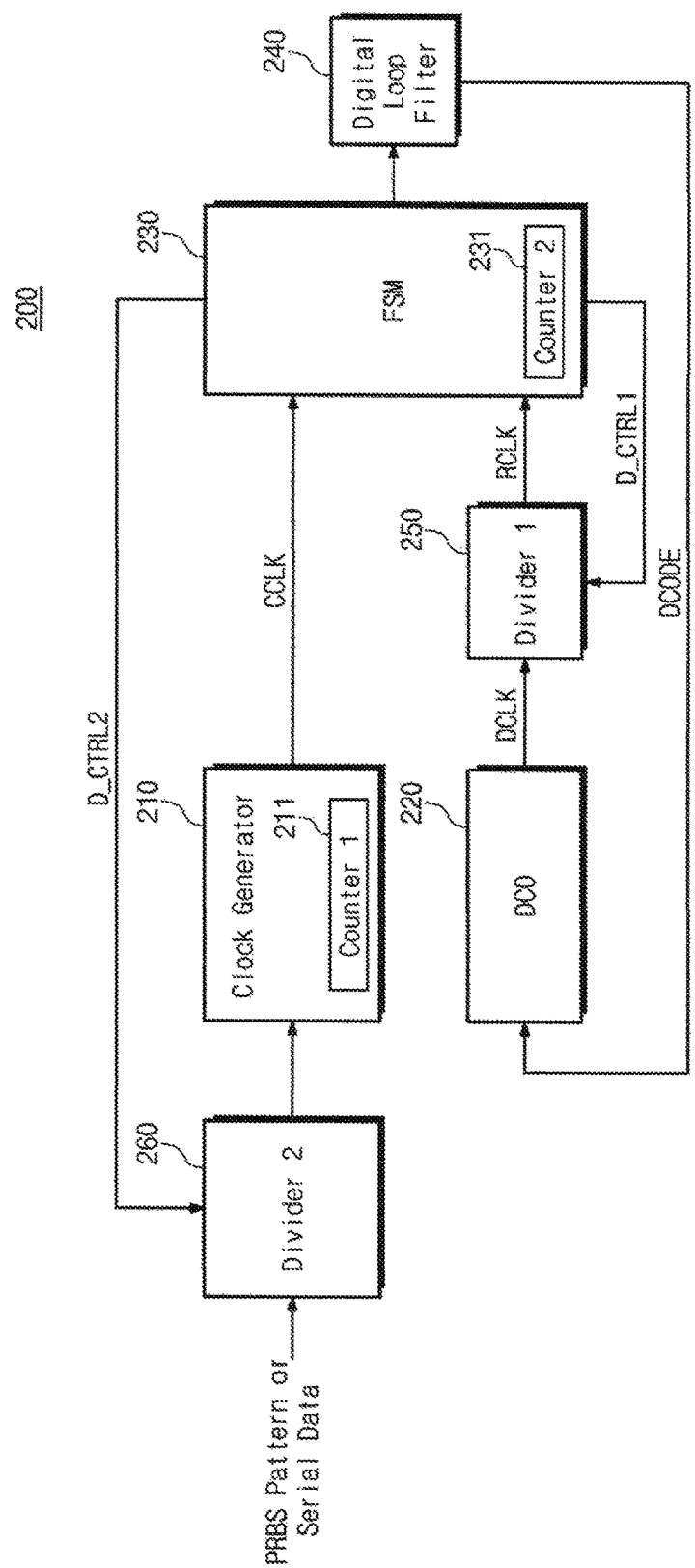
FIGS. 5 and 6 are respective block diagrams further illustrating in other examples the clock recovery circuit of FIG. 1.

FIG. 5 is a block diagram further illustrating in another example (200) the clock recovery circuit 11 of FIG. 1. Referring to FIG. 5, the clock recovery circuit 200 may include a clock generator 210, a DCO 220, a FSM 230, a digital loop filter 240, a first divider 250, and a second divider 260. Operation of the clock generator 210, DCO 220, FSM 230, and digital loop filter 240 is analogous to the operation previously described with reference to FIG. 2.

Additionally, the first divider 250 may be used to adjust the frequency of a DCO clock DCLK generated by the DCO 220. A division ratio may be set by a first divider control signal D_CTRL1 generated by the FSM 230. The first divider 250 may generate a recovery clock RCLK with reference to the first divider control signal D_CTRL1 and the DCO clock DCLK. The frequency of the recovery clock RCLK may be lower than a frequency of the DCO clock DCLK. The FSM 230 may receive a recovery clock RCLK changed by the first divider 250.

When the clock recovery circuit 200 begins operation, a frequency difference between the counter clock CCLK and the recovery clock RCLK may be relatively large. To rapidly correct the frequency of the recovery clock RCLK, the FSM 230 may generate the first divider control signal D_CTRL1 to adjust a division ratio of the first divider 250. The first divider 250 may output the DCO clock DCLK as it is as the recovery clock RCLK with reference to the first divider control signal D_CTRL1.

After the clock recovery circuit 200 begins operation and following a predetermined time, a frequency difference between the counter clock CCLK and the recovery clock RCLK may become small as compared with an initial state of the clock recovery circuit 200. To precisely adjust or correct the frequency of the recovery clock RCLK, the FSM 230 may generate the first divider control signal D_CTRL1 to further adjust a division ratio of the first divider 250. The first divider may lower the frequency of DCO clock DCLK with reference to the first divider control signal D_CTRL1 and may output clock lowered frequency as the recovery clock RCLK. Since the frequency of the recovery clock RCLK is reduced, a second counter 231 will more accurately count the recovery clock RCLK. As the frequency of the recovery clock RCLK is reduced, the second counter 231 will more accurately count the recovery clock RCLK.

The FSM 230 may change a division ratio of the first divider 250 according to a frequency difference between the counter clock CCLK and the recovery clock RCLK. The division ratio of the first divider 250 may be set by the first divider control signal D_CTRL1.

The second divider 260 may be used to change the frequency of a PRBS pattern and/or serial data. A division ratio may be set by a second divider control signal D_CTRL2 generated by the FSM 230. In the case where the frequency of the PRBS pattern and/or serial data is very relatively high, the second divider 260 may reduce the frequency of the PRBS pattern and/or serial data. The clock generator 210 will then receive the PRBS pattern and/or serial data having a reduced frequency as dictated by operation of the second divider 260. Even in the case of receiving high speed serial data or a high speed PRBS pattern, the clock recovery circuit 200 may accurately perform clock and data recovery operations.

Figure 6:
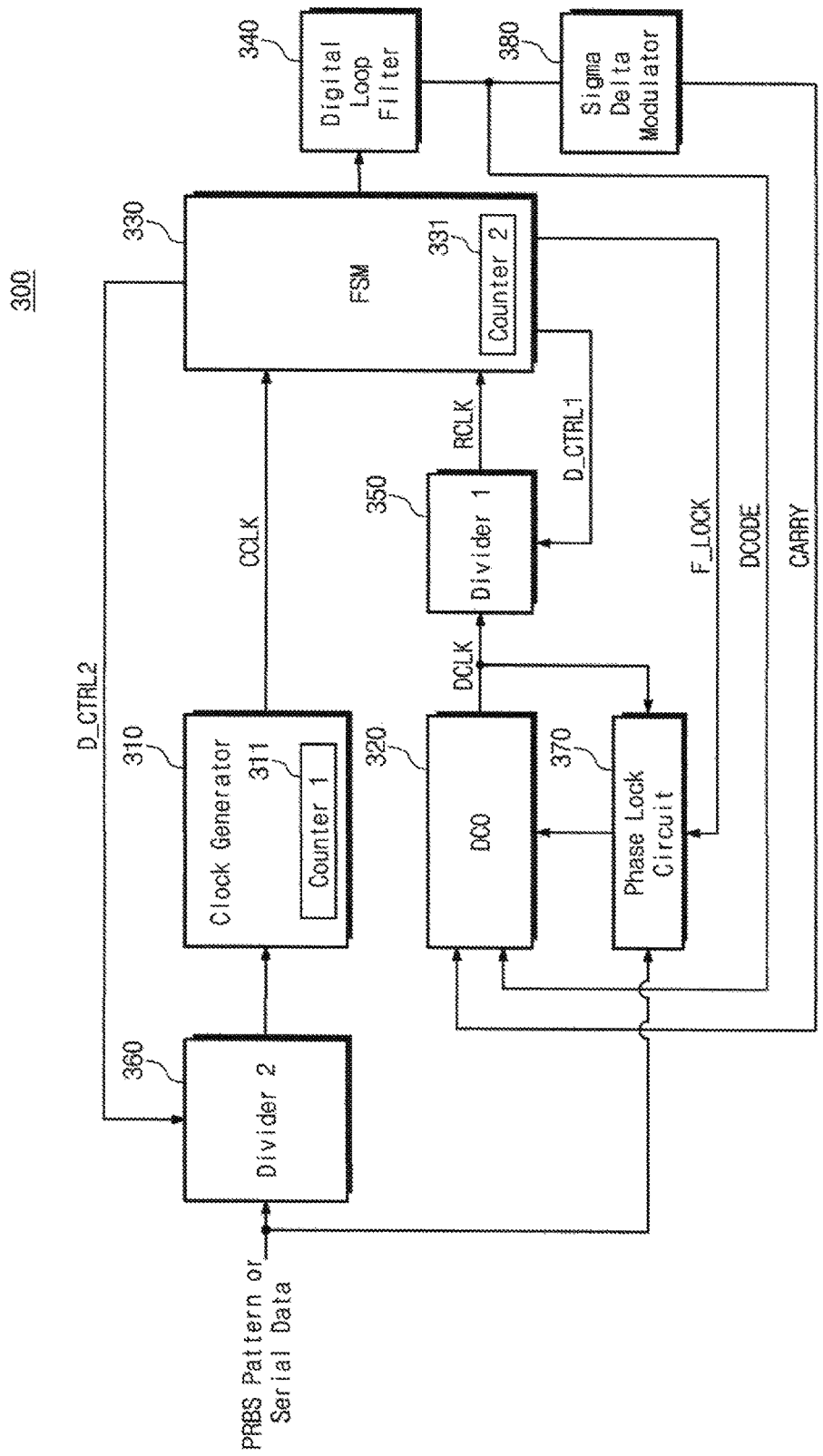

FIG. 6 is a block diagram further illustrating in another example (300) the clock recovery circuit 11 of FIG. 1. Referring to FIG. 6, the clock recovery circuit 300 may include a clock generator 310, a DCO 320, a FSM 330, a digital loop filter 340, a first divider 350, a second divider 360, a phase lock circuit 370, and a sigma delta modulator 380. Operation of the clock generator 310, DCO 320, FSM 330, digital loop filter 340, first divider 350, and second divider 360 is analogous to the operation described in relation to FIG. 5.

Additionally, the phase lock circuit 370 may be used to correct a phase difference between the PRBS pattern and DCO clock DCLK. Alternately or additionally, the phase lock circuit 370 may also be used to correct a phase difference between the PRBS pattern and a recovery clock RCLK. And in a case where the clock recovery circuit 300 does not include the first divider 350, the phase lock circuit 370 may be used to correct a phase difference between the PRBS pattern and a recovery clock RCLK. FIG. 6 describes a case in which the phase lock circuit 370 corrects a phase difference between the PRBS pattern and the DCO clock DCLK.

The phase lock circuit 370 may receive a frequency lock signal F_LOCK generated by the FSM 330. When the aforementioned frequency tracking operation is completed, the FSM 330 may generate the frequency lock signal F_LOCK. When the frequency lock signal F_LOCK is enabled, the phase lock circuit 370 may begin a phase lock operation.

In certain embodiments, the phase lock circuit 370 may include a phase detector, a time to digital converter (TDC), and a loop filter. The phase detector may be used to detect a phase difference between the PRBS pattern and the DCO clock DCLK. For example, the phase detector may be a Bang-Bang phase detector. The TDC may digitalize an output of the phase detector. The loop filter may accumulate the result of the TDC and communicate the accumulated result to the DCO 320. With reference to the accumulated result, the DCO 320 may change the phase of the DCO clock DCLK.

The phase difference between the PRBS pattern and the DCO clock DCLK may become constant by operation of the phase lock circuit 370. For example, edges of the DCO clock DCLK may be aligned toward the center of UI inside the PRBS pattern (i.e., center aligned). Edges of the recovery clock RCLK may be aligned toward the center of UI inside the PRBS pattern. However, the time when edges of the DCO clock DCLK are aligned or the time when edges of the recovery clock RCLK are aligned is not limited to the center of UI. After alignment, the clock data recovery circuit 10 of FIG. 1 may de-serialize the received serial data.

The frequency lock signal F_LOCK may also be applied to DCO 320. With reference to the frequency lock signal F_LOCK, the DCO 320 may operate only a frequency change circuit (not illustrated) included in the digitally controlled oscillator. After the frequency tracking operation is completed, the locked DCO 320 may operate additionally the phase change circuit (not illustrated) with reference to the frequency lock signal F_LOCK.

When a division ratio of the first divider is a fractional value 'N' (e.g., an integer), the sigma delta modulator 380 may be used. The sigma delta modulator 380 may perform a sigma delta modulation with reference to the digital code DCODE and a predetermined feedback coefficient Bi set inside the sigma delta modulator 380. The sigma delta modulator 380 may transmit a carry signal generated by sigma delta modulation to the digitally controlled oscillator 320.

Figure 7:
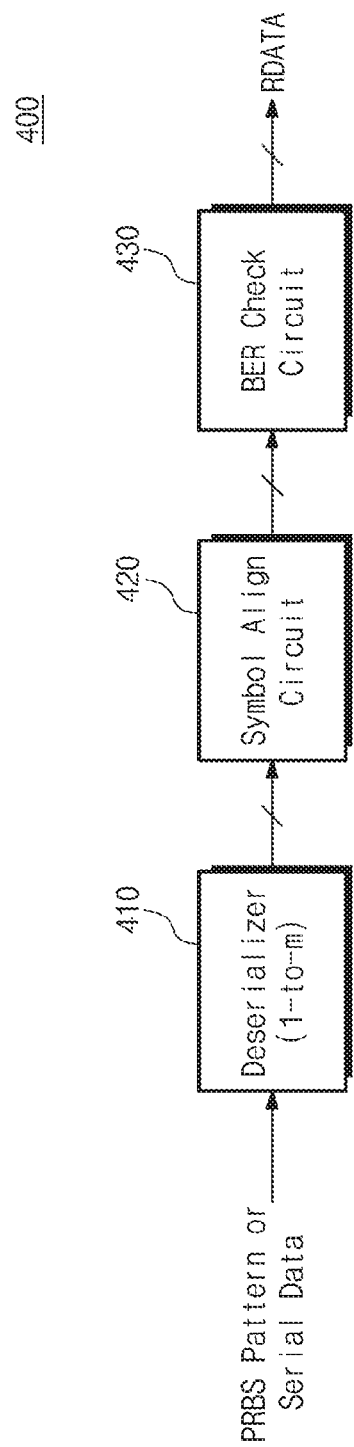
FIG. 7 is a block diagram illustrating in one example the data recovery circuit of FIG. 1.

FIG. 7 is a block diagram further illustrating in one example (400) the data recovery circuit 13 of FIG. 1. Referring to FIG. 7, the data recovery circuit 400 may include a de-serializer 410, a symbol align circuit 420, and a bit error rate check circuit 430.

With reference to FIGS. 6 and 7, the de-serializer 410 may be used to de-serialize a PRBS pattern and/or serial data. Although not illustrated, the de-serializer 410 may perform a deserialization operation using a recovery clock RCLK or a DCO clock DCLK. The de-serializer 410 may de-serialize serialized 'm' number of bits, where 'm' is determined considering an area or performance of the clock data recovery circuit 300 (refer to FIG. 6).

The symbol align circuit 420 may determine whether deserialization data is aligned. If serial data is continuously input to the clock data recovery circuit 10 (refer to FIG. 1), the de-serializer 410 may continuously de-serialize data as much as a window size. Here, the window size may mean the number of bits of serialization data which the de-serializer 410 de-serializes at a time. For example, the window size may be m number of bits. In the case where deserialization time is incorrectly set, the de-serializer 410 continuously de-serializes error data.

The clock data recovery circuit 10 of FIG. 1 may receive the PRBS pattern before the serial data is input. The symbol align circuit 420 may include a circuit generating the PRBS pattern received by the clock data recovery circuit 10 as it is. The symbol align circuit 420 may recognize the PRBS pattern beforehand. The symbol align circuit 420 may include a register (not illustrated) in which data inside the PRBS pattern is stored instead of a PRBS pattern generator (not illustrated).

The symbol align circuit 420 may compare data inside the PRBS pattern with deserialization data transmitted from the de-serializer 410. In the case where the two data don't coincide with each other, the symbol align circuit 420 may adjust deserialization time of the de-serializer 410. In the case where the two data coincide with each other, the symbol align circuit 420 may continuously maintain deserialization time of the de-serializer 410. An operation of the symbol align circuit 420 will be described in FIG. 8 in detail.

The bit error rate check circuit 430 may check an error data rate of deserialization data. The bit error rate may be a value obtained by dividing error bits by transmitted bits. As described above, data in the PRBS pattern may be known beforehand. The bit error rate check circuit 430 may compare whether the deserialization data coincides with the data inside the PRBS pattern.

In the case where the bit error rate is smaller than a reference value, the bit error rate check circuit 430 may transmit recovery data RDATA to the link layer of FIG. 1. Here, the reference value may be set with reference to a specification of the clock recovery circuit 300. The bit error check circuit 430 may include a register (not illustrated) that stores the reference value. In the case where the bit error rate is greater than the reference value, the bit error rate check circuit 430 may not transmit deserialization data to the link layer. In this case, the clock data recovery circuit 10 of FIG. 1 may perform the training operation again.

Figure 8:
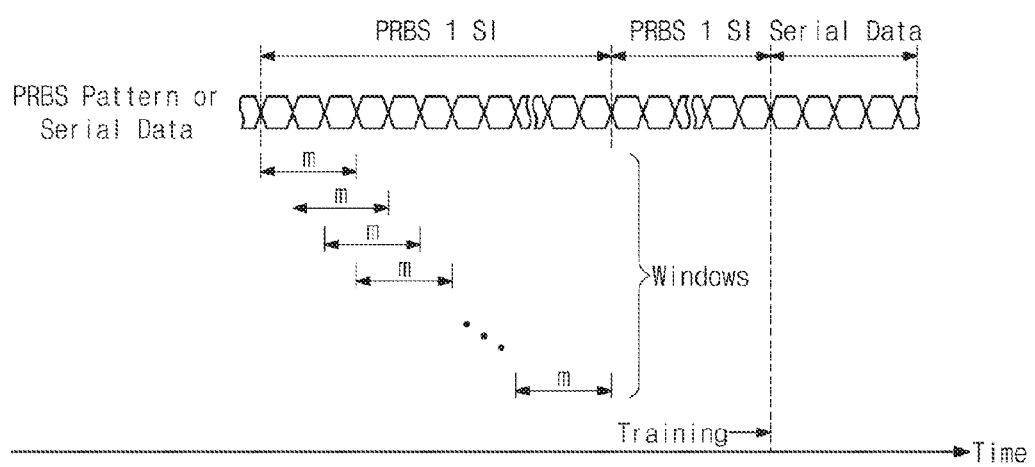
FIG. 8 is a timing diagram further illustrating operation of the symbol align circuit of FIG. 7.

FIG. 8 is a timing diagram illustrating in one example the operation of the symbol align circuit 420 of FIG. 7. With reference to FIGS. 7 and 8, after the PRBS pattern is input to the de-serializer 410, the serial data may be sequentially input to the de-serializer 410.

Thus, data corresponding to each window may be de-serialized. The symbol align circuit 420 may determine whether the deserialization data coincides with data inside the PRBS pattern. In the case where the deserialization data coincides with data inside the PRBS pattern, the symbol align circuit 420 may set deserialization time of the de-serializer 410 based on the window in which the deserialization data coincides with data inside the PRBS pattern. After that, the de-serializer 410 may de-serialize serial data based on the deserialization time.

Figure 9:
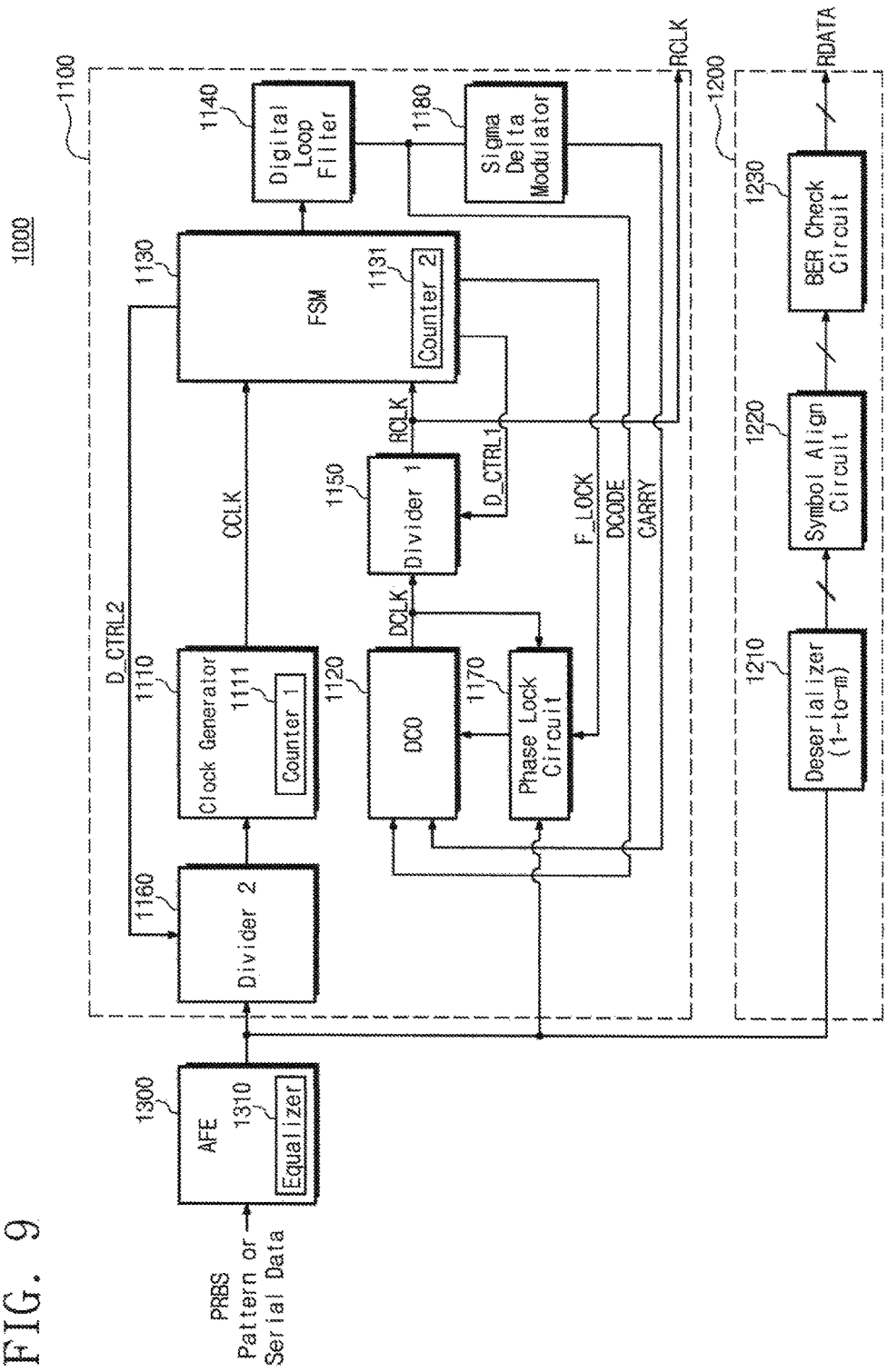
FIG. 9 is a block diagram illustrating a clock data recovery circuit according to an embodiment of the inventive concept.

FIG. 9 is a block diagram illustrating a clock data recovery circuit according to another embodiment of the inventive concept. Referring to FIG. 9, a clock data recovery circuit 1000 generally includes a clock recovery circuit 1100, a data recovery circuit 1200, and an analog front end (AFE) 1300.

The clock recovery circuit 1100 may include a clock generator 1110, a digitally controlled oscillator (DCO) 1120, a finite state machine (FSM) 1130, a digital loop filter 1140, a first divider 1150, a second divider 1160, a phase lock circuit 1170, and a sigma delta modulator 1180. Since the constituent elements described above were described in FIG. 6, a duplicate description thereof is omitted.

The data recovery circuit 1200 may include a de-serializer 1210, a symbol align circuit 1220, and a bit error rate check circuit 1230. Since the constituent elements described above were described in FIG. 7, a duplicate description thereof is omitted.

The AFE 1300 may receive a PRBS pattern and/or serial data. The PRBS pattern or the serial data may be transmitted in an analog method instead of a digital method to transmit the PRBS pattern or the serial data for high speed transmission. The AFE 1300 may digitalize data transmitted in an analog method. The AFE 1300 may transmit the received PRBS pattern and/or the received serial data to the clock recovery circuit 1100 and the data recovery circuit 1200.

The AFE 1300 may include an equalizer 1310. The analog front end (AFE) 1300 may receive the PRBS pattern or the serial data at high speed. Due to a loading of a transmission channel, an inter-symbol interference (ISI) may occur in the PRBS pattern or the serial data. The equalizer 1310 may reduce the inter-symbol interference (ISI) in the PRBS pattern or the serial data.

The clock data recovery circuit 1000 may receive the PRBS pattern instead of the clock recovery (CR) pattern and the equalization (EQ) pattern. Since the PRBS pattern includes data, the equalizer 1310 may perform an equalizing operation using the PRBS pattern.

A general clock data recovery circuit may receive the CR pattern to perform the frequency tracking operation and the phase tracking operation. Thereafter, the general clock data recovery circuit may receive the EQ pattern to perform the equalizing operation, the symbol alignment operation, and the bit error rate check operation.

The clock data recovery circuit 1000 may perform the frequency tracking operation, the phase tracking operation, the equalizing operation, the symbol alignment operation, and the bit error rate check operation at a time using the PRBS pattern. The clock data recovery circuit 1000 may reduce a training time through the PRBS pattern.

Figure 10:
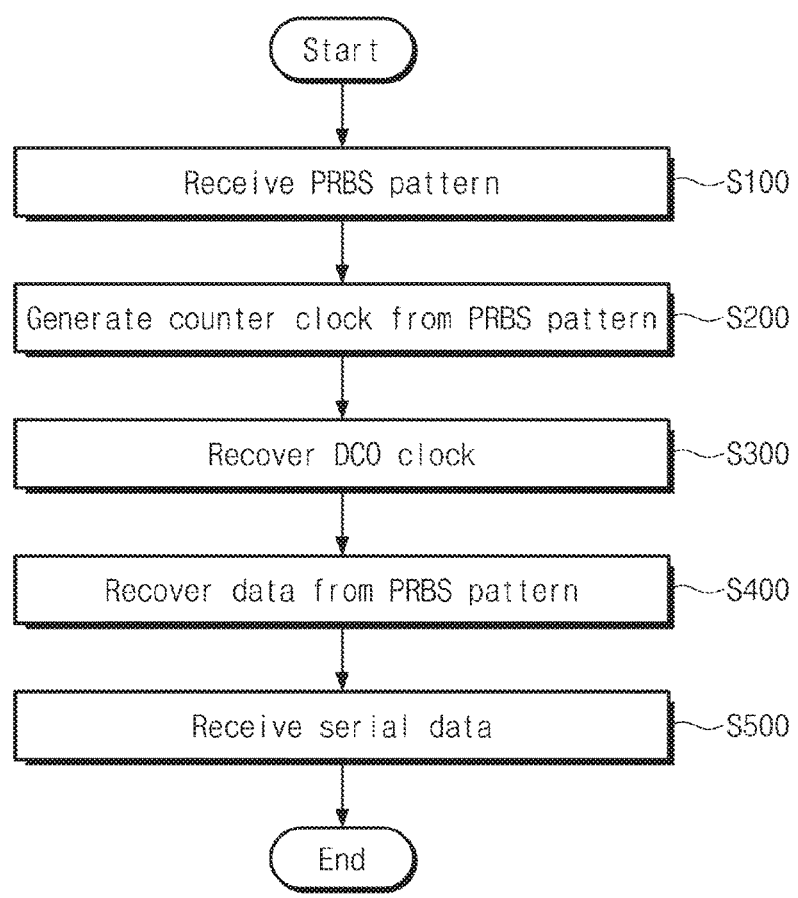
FIG. 10 is a flowchart summarizing a method of operating a clock data recovery circuit according to certain embodiments of the inventive concept.

FIG. 10 is a flowchart summarizing a method of operating a clock data recovery circuit according to certain embodiments of the inventive concept. The method of FIG. 10 will be described with reference to the clock data recovery circuit of FIG. 9.

In an operation S100, the clock data recovery circuit 1000 may receive the PRBS pattern.

In an operation S200, the clock data recovery circuit 1000 may generate a counter clock CCLK from the PRBS pattern. A process in which the clock data recovery circuit 1000 generates the counter clock CCLK will be described in FIG. 11 in detail.

In an operation S300, the clock data recovery circuit 1000 may recover a DCO clock DCLK. The clock data recovery circuit 1000 may compare a frequency of the DCO clock DCLK with a frequency of the counter clock CCLK.

The clock data recovery circuit 1000 may set the frequency of the DCO clock DCLK similar to the frequency of the counter clock CCLK. The clock data recovery circuit 1000 may set a phase of the DCO clock DCLK with reference to the PRBS pattern. Each of edges of the DCO clock DCLK may be aligned toward the center of UI inside the PRBS pattern.

In an operation S400, the clock data recovery circuit 1000 may recover data using the PRBS pattern. The clock data recovery circuit 1000 may use a clock recovered in the operation S300. After the operation S400 is completed, the training operation may be finished. The operation of the clock data recovery circuit 1000 in the operations S100 to S400 may be considered as the training operation.

In an operation S500, the clock data recovery circuit 1000 may receive the serial data. The clock data recovery circuit 1000 may recover the serial data. After that, the recovered serial data may be transmitted to the link layer (refer to FIG. 1).

Figure 11:
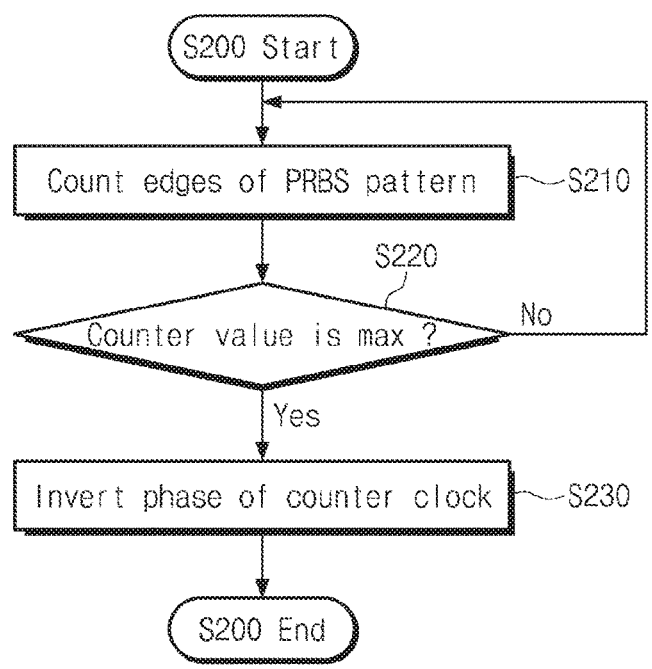
FIGS. 11, 12 and 13 are respective flowcharts more particularly illustrating examples of operations S200, S300 and S400 of FIG. 10.

FIG. 11 is a flowchart further illustrating in one example the operation S200 of FIG. 10.

With reference to FIGS. 9, 10 and 11, a first counter 1111 may count edges of the PRBS pattern in operation S210. The first counter 1111 may count rising edges and/or falling edges. A counted value generated by the first counter 1111 may be incremented with each edge.

In an operation S220, the clock generator 1110 may determine whether the counted value has reached a maximum count value. In the case where the counted value reaches the maximum value (S220=Yes), an operation S230 may be performed. In the case where the counting value does not reach the maximum value (S220=No), the operation S210 may be performed again.

In the operation S230, the clock generator 1110 may invert a phase of the counter clock CCLK. Whenever the counting value reaches the maximum value, the phase of the counter clock CCLK may be periodically inverted. The counter clock CCLK may be transmitted to the FSM 1130. In the case where after the phase of the counter clock CCLK is inverted, an edge is input to the first counter 1111, the counting value may be initialized.

Figure 12:
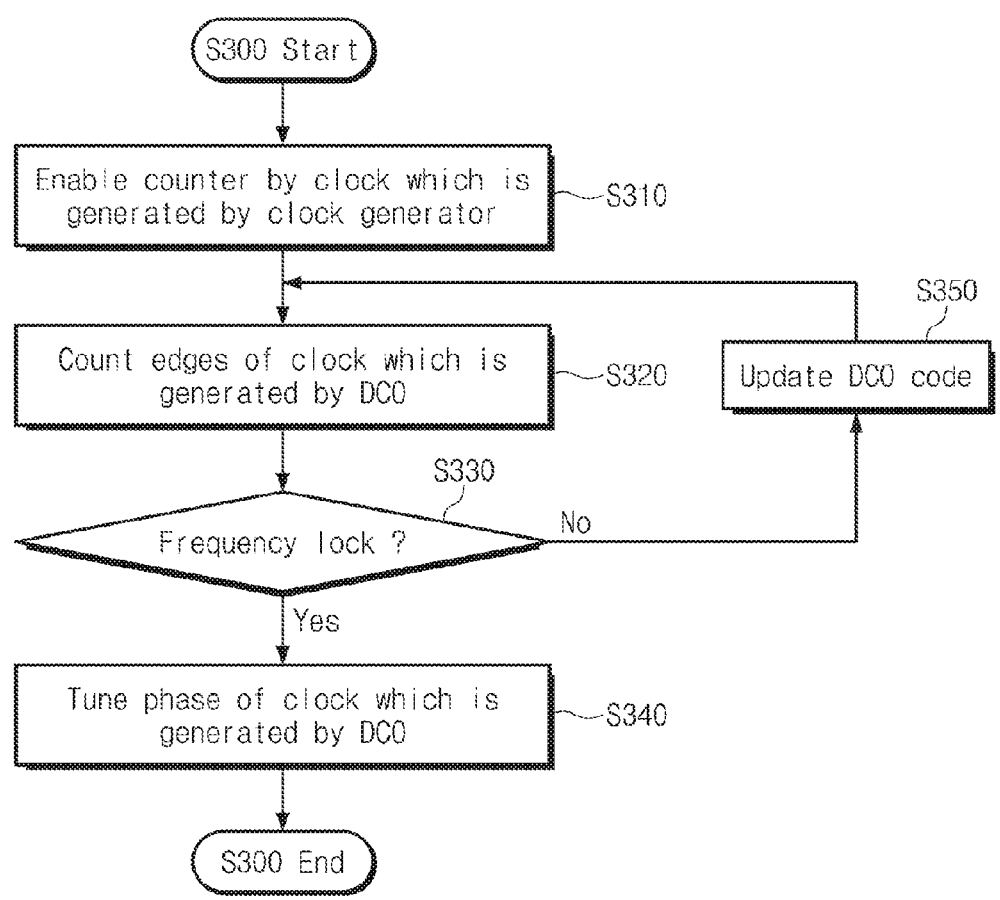

FIG. 12 is a flowchart further illustrating in one example the operation S300 of FIG. 10.

With reference to FIGS. 9, 10 and 12, with reference to the counter clock CCLK, the FSM 1130 may generate a counter enable signal that determines whether a second counter 1131 operates in operation S310. The second counter 1131 may be enabled by the counter enable signal.

In an operation S320, during a section in which the counter enable signal is enabled, the second counter 1131 may increase the counting value at every edge. Referring to FIG. 9, the clock recovery circuit 1100 includes the first divider 1150. In the case where the clock recovery circuit 1100 does not include the first divider 1150, the second counter 1131 may increase the counting value at every edge of the DCO clock DCLK. Here, the edge may be either a rising edge or a falling edge.

In an operation S330, the FSM 1130 may check whether a frequency of a recovery clock RCLK is locked. The second counter 1131 of the FSM 1130 may count the recovery clock RCLK. The FSM 1130 may check whether the frequency of the recovery clock RCLK is locked. Specifically, the FSM 1130 may check whether the counting value reaches the reference range. The reference range may be set according to the PRBS pattern. In the case where the counting value reaches the reference range (S330=Yes), an operation S340 may be performed. In the case where the counting value is out of the reference range (S330=No), an operation S350 may be performed.

In the operation S340, the FSM 1130 may generate a frequency lock signal (F_LOCK). When the frequency lock signal (F_LOCK) is enabled, the phase lock circuit 1170 may begin its operation. The phase lock circuit 1170 may correct a phase difference between the PRBS pattern and the DCO clock DCLK.

In the operation S350, the FSM 1130 may transmit a comparison result of the frequency of the counter clock CCLK and the frequency of the recovery clock RCLK to the digital loop filter 1140. The digital loop filter 1140 may update a digital code DCODE with reference to the comparison result from the FSM 1130.

Figure 13:
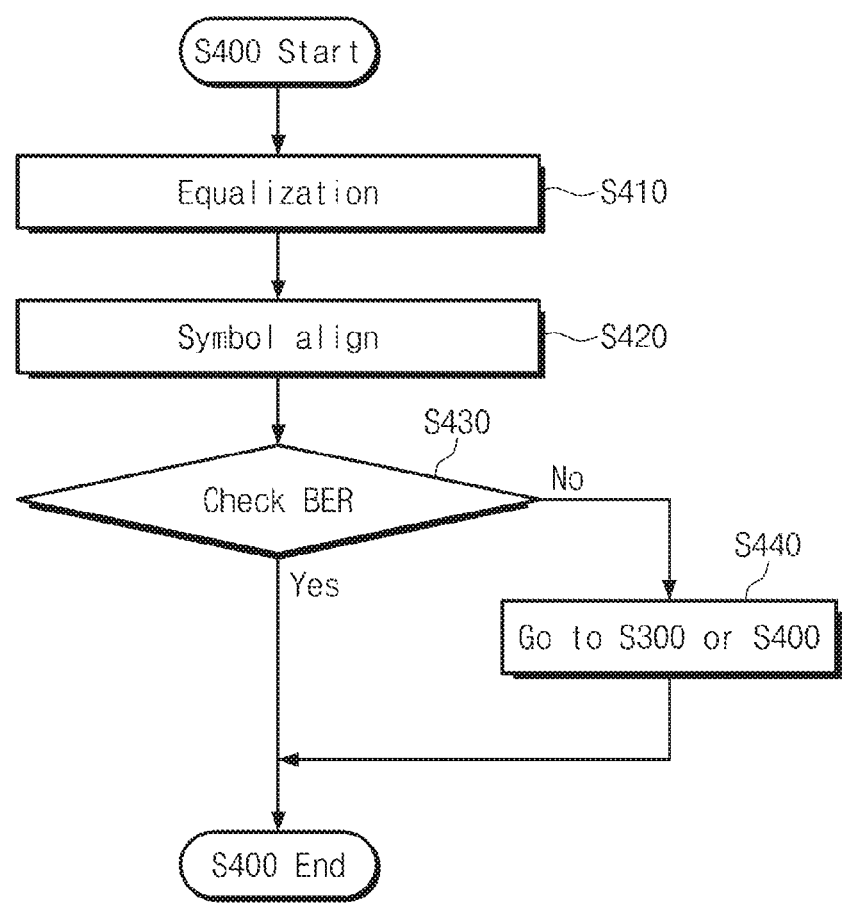

FIG. 13 is a flowchart further illustrating in one example the operation S400 of FIG. 10.

With reference to FIGS. 9, 10 and 13, an equalizer 1310 may reduce inter-symbol interference inside the PRBS pattern in an operation S410. In the operation S410, the equalizer 1310 may perform an equalizing operation with reference to the recovery clock RCLK of the clock recovery circuit 1100.

In an operation S420, the symbol alignment circuit 1220 may check whether predetermined data coincides with deserialization data by the de-serializer 1210. The predetermined data may mean data inside the PRBS pattern. In the case where the deserialization data does not coincide with the predetermined data, the symbol alignment circuit 1220 may adjust deserialization time.

In an operation S430, the bit error rate check circuit 1230 may check an error data rate of the deserialization data. In the case where the bit error rate is smaller than a reference value (S430=Yes), an operation S400 is finished. In the case where the bit error rate is higher than a reference value (S430=No), either the operation S300 or the operation S400 may be performed again.

Figure 14:
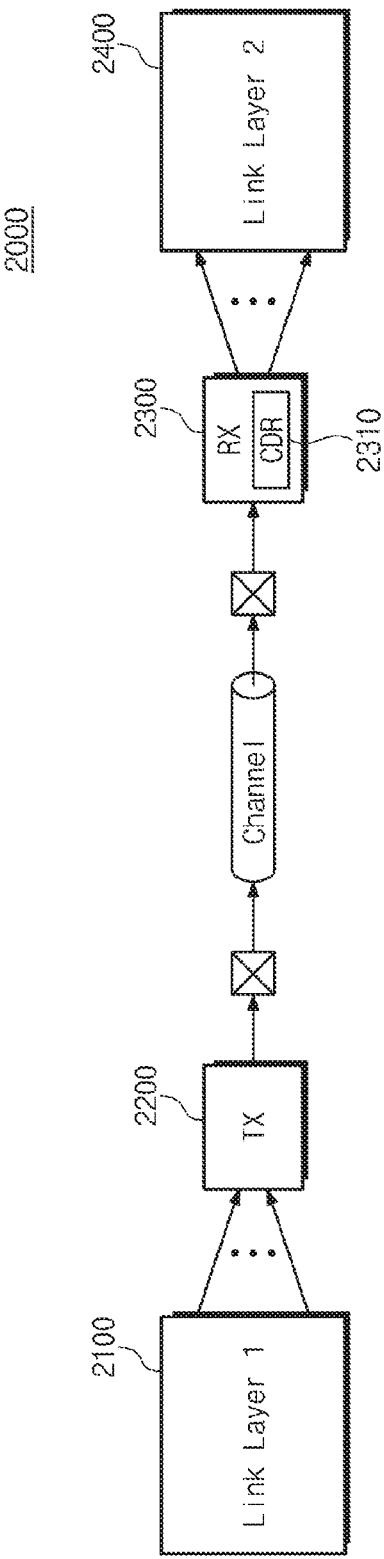
FIG. 14 is a block diagram illustrating a data communication system that may include one or more clock data recovery circuit(s) according to embodiments of the inventive concept.

FIG. 14 is a block diagram of a data communication system 2000 that may include a clock data recovery circuit according to embodiments of the inventive concept. Referring to FIG. 14, the data transmission system 2000 may include a first link layer 2100, a transmission circuit TX 2200, a reception circuit RX 2300, and a second link layer 2400.

The first link layer 2100 may transmit data to the transmission circuit TX 2200 in parallel. The transmission circuit TX 2200 may serialize deserialization data. The transmission circuit TX 2200 may transmit serial data to the reception circuit RX 2300 at high speed. The reception circuit RX 2300 may receive the serial data. The reception circuit 2300 may include a clock data recovery circuit 2310. The reception circuit 2300 may transmit the received serial data to the second link layer 2400 in parallel.

The clock data recovery circuit according to example embodiments of the inventive concept may perform a frequency tracking operation, a phase tracking operation, an equalizing operation, a symbol alignment operation, and a bit error rate check operation through a PRBS pattern.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A clock data recovery circuit comprising:
    a clock recovery circuit that receives a pseudo random binary sequence (PRBS) pattern, generates a recovery clock by counting edges of the PRBS pattern and comprises;
        a clock generator including a first counter that generates a counted value by counting edges of the PRBS pattern and generates a counter clock with reference to the counted value;
        a finite state machine (FSM) that compares the counter clock with the recovery clock and generates a comparison result;
        a digital loop filter that accumulates the comparison result and generates a digital code; and
        a digitally controlled oscillator (DCO) that generates the recovery clock in response to the digital code; and
    a data recovery circuit that generates recovery data from at least one of the PRBS pattern and externally provided serial data.

2. The clock data recovery circuit of claim 1, wherein the first counter transitions from a maximum counted value to an initial value, and in response to the first counter transitioning from the maximum counted value to the initial value, the clock generator inverts a phase of the counter clock.

3. The clock data recovery circuit of claim 1, wherein the FSM comprises a second counter that counts edges of the recovery clock.

4. The clock data recovery circuit of claim 1, wherein the clock recovery circuit further comprises a first divider that changes a frequency of the recovery clock and a second divider that changes a frequency of the PRBS pattern, wherein the FSM receives a recovery clock changed by the first divider and the clock generator receives a PRBS pattern changed by the second divider.

5. The clock data recovery circuit of claim 4, wherein the clock recovery circuit further comprises a phase lock circuit that locks a phase of the recovery clock with reference to the PRBS pattern.

6. The clock data recovery circuit of claim 5, wherein the FSM transmits a frequency lock signal to the phase lock circuit and the phase lock circuit begins a phase lock operation in response to the lock signal when the frequency of the recovery clock reaches a target frequency range.

7. The clock data recovery circuit of claim 1, wherein the data recovery circuit comprises:
    a de-serializer that de-serializes the at least one of the PRBS pattern and the serial data to generate deserialization data;
    a symbol align circuit that sets deserialization time for the de-serializer; and
    a bit error rate check circuit that determines an error in the deserialization data.

8. The clock data recovery circuit of claim 7, further comprising an equalizer that reduces inter-symbol interference between the PRBS pattern and the serial data.

9. The clock data recovery circuit of claim 1 further comprising:
    a first divider that receives a clock generated by the DCO (DCO clock) and adjusts a frequency of the DCO clock to generate the recovery clock; and
    a second divider that receive the PRBS pattern, adjusts a frequency of the PRBS pattern to generate a frequency adjusted PRBS pattern,
    wherein the frequency adjusted PRBS pattern is provided to the clock generator and the clock generator generates the counted value by counting edges of the frequency adjusted PRBS pattern.

10. The clock data recovery circuit of claim 9, wherein a first division ratio for the first divider is set by a first divider control signal generated by the FSM, and a second division ratio for the second divider is set by a second divider control signal generated by the FSM.

11. The clock data recovery circuit of claim 10, wherein the first divider control signal is varied by the FSM in response to a frequency difference between the counter clock and the recovery clock RCLK.

12. The clock data recovery circuit of claim 9, wherein the frequency of the PRBS pattern is greater than the frequency of the adjusted PRBS pattern.

13. A method of operating a clock data recovery circuit including a digitally controlled oscillator (DCO), the method comprising:
   receiving a pseudo random binary sequence (PRBS) pattern;
   generating a counter clock from the PRBS pattern by counting edges of the PRBS pattern to generate a counted value, determining whether the counted value reaches a maximum counted value, and upon determining that the counted value has reached the maximum counted value, inverting a phase of the counter clock;
   recovering a clock of the DCO (DCO clock) with reference to the counter clock;
   recovering data from the PRBS pattern with reference to the DCO clock; and
   recovering serial data from externally provided serial data.

14. The method of claim 13, wherein the recovering of the DCO clock comprises:
   counting edges of the DCO clock to generate a DCO counted value;
   determining whether the DCO counted value is within a reference range; and
   adjusting a phase of the DCO clock with reference to the PRBS pattern upon determining that the DCO counted value falls within the reference range.

15. The method of claim 14, wherein the recovering of the DCO clock further comprises, updating a control code for the DCO upon determining that the DCO count value is not within the reference range.

16. The method of claim 13, wherein the recovering of the serial data comprises:
   performing an equalizing operation of the PRBS pattern with reference to the recovered clock;
   de-serializing the PRBS pattern and setting a deserialization time; and
   determining a bit error rate (BER) for the recovered serial data.

17. The method of claim 16, wherein the recovering of the serial data further comprises, performing either the recovering of the DCO clock or the recovering data from the PRBS pattern upon determining that the BER is greater than a reference value.

18. A method of operating a data communication system, the method comprising:
   providing parallel data from a first link layer to a transmission circuit;
   converting the parallel data into serial data in the transmission circuit;
   transmitting a pseudo random binary sequence (PRBS) pattern and the serial data from the transmission circuit to a reception circuit including a clock data recovery circuit via a channel; and
   using the clock data recovery circuit including a digitally controlled oscillator (DCO) to recover the serial data by performing at least one of a frequency tracking operation, a phase tracking operation, an equalizing operation, a symbol alignment operation, and a bit error rate check operation with reference to the PRBS pattern,
   wherein the recovering of the serial data comprises;
   generating a counter clock from the PRBS pattern, recovering a clock of the DCO (DCO clock) with reference to the counter clock, counting edges of the PRBS pattern to generate a counted value, determining whether the counted value reaches a maximum counted value, and upon determining that the counted value has reached the maximum counted value, inverting a phase of the counter clock.

19. The method of claim 18, wherein the recovering of the serial data further comprises:
   performing the equalizing operation on the PRBS pattern with reference to a recovered clock;
   de-serializing the PRBS pattern and setting a deserialization time; and
   determining a bit error rate (BER) for the recovered serial data.

20. The method of claim 19, wherein the recovering of the serial data further comprises, performing either the recovering of the DCO clock or the recovering data from the PRBS pattern upon determining that the BER is greater than a reference value.

* * * * *